(12) United States Patent
Geusic et al.

(10) Patent No.: US 6,582,512 B2
(45) Date of Patent: Jun. 24, 2003

(54) METHOD OF FORMING THREE-DIMENSIONAL PHOTONIC BAND STRUCTURES IN SOLID MATERIALS

(75) Inventors: Joseph E. Geusic, Berkeley Heights, NJ (US); Kevin G. Donohoe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/861,770

(22) Filed: May 22, 2001

(65) Prior Publication Data

US 2002/0175330 A1 Nov. 28, 2002

(51) Int. Cl.[7] .............................. C30B 1/02; C30B 29/08
(52) U.S. Cl. ..................... 117/3; 117/2; 117/4; 117/8; 117/9; 117/935; 438/694
(58) Field of Search ..................... 117/1, 2, 3, 935, 117/4, 8, 9; 438/694

(56) References Cited

U.S. PATENT DOCUMENTS 6,375,737 B2 * 4/2002 Shih et al. .................... 117/3

OTHER PUBLICATIONS

Muller et al., "Simulated Annealing of Porous Silicon", Physics of Solid State (a) vol. 182 2000, pp. 313–318.*

"Surface—(Interface–) and Volume–Diffusion Contributions to Morphological Changes Driven by Capillarity" by F.A. Nichols and W.W. Mullins, Transactions of The Metallurgical Society of AIME, vol., 233, Oct. 1965., pp. 1840–1848.

"Two–dimensional Infrared Photonic Band Gap Structure Based on Porous Silicon", by U. Gruning, et al., Appl. Phys. Latt., vol. 66, No. 24, Jun. 1995, pp. 3254–3256.

"Carbon Structures with Three–Dimensional Periodicity at Optical Wavelengths", by Anvar A. Zakhidov, et al., Science, vol. 282, Oct. 1998, pp. 897–901.

"Trench Transformation Technology Using Hydrogen Annealing for Realizing Highly Reliable Device Structure with Thin Dielectric Films", by Tsutomu Sato, et al., 1999 IEEE, pp. 206–207.

"Direct Visualization of Photonic Band Structure for Three–Dimensional Photonic Crystals", by M. Notomi, et al., Physics Review B, vol. 61, No. 11, Mar. 2000, pp. 7165–7168.

* cited by examiner

Primary Examiner—Robert Kunemund
(74) Attorney, Agent, or Firm—Dickstein Shapiro Morin & Oshinsky LLP

(57) ABSTRACT

A method of forming a periodic index of refraction pattern in a superlattice of a solid material to achieve photonic bandgap effects at desired optical wavelengths is disclosed. A plurality of space group symmetries, including a plurality of empty-spaced buried patterns, are formed by drilling holes in the solid material and annealing the solid material to form empty-spaced patterns of various geometries. The empty-spaced patterns may have various sizes and may be formed at different periodicities, so that various photonic band structures can be produced for wavelength regions of interest.

71 Claims, 11 Drawing Sheets

METHOD OF FORMING THREE-DIMENSIONAL PHOTONIC BAND STRUCTURES IN SOLID MATERIALS

FIELD OF THE INVENTION

The present invention relates to semiconductor devices and methods of making such devices. More particularly, the invention relates to solid state materials and to a novel method of forming three-dimensional photonic band structures in such materials.

BACKGROUND OF THE INVENTION

Monocrystalline solid state materials, such as single-crystal semiconductors, are the basis of the current microelectronics industry. Each single crystalline solid is a periodic structure in space, with a basic repeating unit called the unit cell. Crystalline solids are characterized by a variety of properties, for example, electrical properties such as electrical conductivity or charge mobility, optical properties such as refractive index or speed of photons, thermal properties such as thermal conductivity or thermal expansion, mechanical properties such as stress or strain curves, and chemical properties such as resistance to corrosion or reaction consistency, among others.

Over the past ten years, theoretical end experimental interests have evolved around the electromagnetic radiation propagating in periodic crystalline structures. The core of these experiments has been the condition for the elastic diffraction of X rays (electromagnetic waves) in a crystal, a phenomenon in which the X rays change their direction without changing their frequencies, and consequently, without changing their energies. The condition that an incident beam of X rays $q_0$ comes off in the same direction from each scattering center is exemplified in FIG. 1. On a line of atoms of the same kind, situated along the x-axis of a crystal and spaced apart at a distance "a" (in a normal crystal, atoms are spaced apart at a distance "a" of about 4–5 Angstroms), an X ray beam $q_0$ with a definite wave vector impinges on the line of atoms from an angle $\alpha_0$ and comes off with wave vector q in the direction $\alpha$, as shown in FIG. 1. The condition that the beam $q_0$ comes off in the same direction from each scattering center is the following formula:

$$a(\cos \alpha - \cos \alpha_0) = N\lambda \quad (1)$$

wherein: a=the distance between any two adjacent atoms or scattering centers;

$\alpha_0$=the incidence angle of the X ray beam;

$\alpha$=the diffraction angle of the X ray beam;

N=an integer; and $\lambda$=the wavelength of the X ray beam.

The equation (1) is the condition that the scattered waves interfere constructively in the direction q, so that the beam of X rays sent into a crystal comes out scattered coherently, elastically, into various directions, each of which representing a momentum transfer that satisfies equation (1). As known in the art, equation (1) applies to other scattering/diffraction structures such as gamma rays, electron beam, ions, and photons, among others.

It is well-known that electrons in ordinary matter exhibit behavior analogous to the diffraction of light waves in crystalline solids which was exemplified above and quantified by equation (1). As such, it is now common knowledge that electrons in a crystalline solid produce electrical conductivity by a constructive interference of various scattering trajectories, as a result of the diffraction of electrons from the periodic potential of the atomic lattice. This way, the wave nature of the electrons and the periodic lattice of atoms can give rise to both allowed energy bands (a result of the constructive interference effects of electrons) and forbidden energy gaps, also called electron bandgaps (a result of the destructive interference effects of electrons) for the electrons in a crystalline solid. These constructive and destructive interferences of electrons in superlattices are the basis of the electronic behavior of metals, semiconductors and insulators, which are of fundamental importance to the semiconductor industry.

Over the past years, the creation of analogous forbidden electromagnetic or photonic bandgaps in crystalline solids has been recognized as a promising way of obtaining novel properties in crystalline solids. Similar to the case of electrons, the photonic bandgaps arise from the destructive interference effects of electromagnetic waves for certain wavelengths and directions, and are characterized by the inhibition of optical propagation in the crystal. An experiment by Yablonovitch et. al (E. Yablonovitch. Phys. Rev. Lett., 58, 2059 (1987)) has suggested that the electromagnetic radiation propagating in periodic dielectric structures is similar to the electron waves propagating in a crystal. Yablonovitch et. al realized that setting up a periodic index of refraction pattern in a material can produce a band structure for electromagnetic waves where certain wavelengths can or cannot propagate, producing therefore the electromagnetic wave equivalent of a metal, semiconductor or insulator. If the wavelength is in the order of the dimensions of the crystal lattice, a photonic bandgap (a frequency range where photons are not allowed to propagate) can open up in two or three dimensions and lead to interesting phenomena, such as inhibition of spontaneous emission from an atom that radiates inside the photonic gap or frequency selective transmission and reflection. This way, for example, if a photonic crystal can be constructed to posses a full photonic bandgap, then a photonic insulator is created by artificially controlling the optical properties of the solid.

Since the findings of Yablonovitch et al, numerous experiments have been carried out to realize photonic bandgap effects at optical wavelengths. For example, in *Direct visualization of photonic band structure for three-dimensional photonic crystals*, Phys. Rev. B, 61, 7165 (2000), Notomi et al. have realized photonic bandgap effects by using shape formation by bias sputtering. For this, the experiments and measurements of Notomi et al. were carried out on a three-dimensional periodic index of refraction structure, that is a $Si/SiO_2$ alternating-layer 3D hexagonal photonic crystal fabricated by autocloning bias-sputtering deposition, and illustrated in FIG. 2.

Similarly, Gruning et al. have fabricated a two-dimensional photonic band structure in macroporous silicon, with pores grown in a random pattern and formed by an electrochemical pore formation process (*Two-dimensional infrared photonic bandgap structure based on porous silicon*, Appl. Phys. Lett. 68, 747 (1996)). Zakhidov et al. also realized a three-dimensional porous carbon formed by sintering crystals of silica opal to obtain an intersphere interface through which the silica was subsequently removed after infiltration with carbon or a carbon precursor (*Carbon Structures with Three-Dimensional Periodicity at Optical Wavelengths,* Science, 282, 897 (1998)).

One of the limitations inherent in all the above-mentioned photonic lattices experiments is the requirement that the dimensions of the lattice must be in the same order of magnitude as the desired band gap wavelength, or in other words, the refractive index variations or discontinuities should have periodicities on the same scale as the wavelength. As the dimensions of the lattice must be in the same order of magnitude as the desired band gap wavelength, the scaling down to the interesting optical and infrared frequencies has posed problems due to the demanded regularity and uniformity of the photonic lattice. In addition, as two-dimensional photonic band gaps structures are technologically easier to fabricate, recent fabrication methods have focussed mainly on two dimensions, particularly on a regular hole structure in a dielectric material, and not on the more complex three dimensions. Further, although sub-micron photonic structures have been successfully fabricated in AlGaAs and/or GaAs, extreme process conditions are necessary to achieve lattice depths of less than a micron in these structures.

Accordingly, there is a need for an improved method of fabricating three-dimensional photonic bandgap structures in a wide variety of solid materials, such as monocrystalline substrates, dielectrics, superconducting materials or magnetic materials, among others. There is also a need for a more advantageous method of generating a wide variety of space group symmetries, with different group symmetries for wavelength regions of interests, in such variety of solid materials. A method of controlling the dimensions of photonic lattices to acquire a predetermined band structure for electromagnetic waves so that diffraction occurs in a specific, predetermined wavelength is also desired.

SUMMARY OF THE INVENTION

The present invention provides a method of forming a periodic index of refraction pattern in the supperlattice of a solid material to achieve photonic bandgap effects at desired optical wavelengths. According to an exemplary embodiment of the invention, a plurality of space group symmetries are formed by surface transformation in a solid material, for example in a monocrystalline silicon substrate or an insulator, to control the optical and electromagnetic properties of such solid material. The space group symmetries include a plurality of empty-spaced void patterns which are formed in the solid material by drilling holes to a predefined depth and at a predefined lattice position, and then heating the material at a temperature close to the melting point of the solid material, to spontaneously form the void patterns at the desired lattice position. The empty-spaced voids may have various geometries and sizes and may be formed at different periodicities and in a variety of space group symmetries, so that photonic bandgap structures can be produced for wavelength regions of interest.

These and other features and advantages of the invention will be more clearly apparent from the following detailed description which is provided in connection with accompanying drawings and which illustrates exemplary embodiments of the invention.

DETAILED DESCRIPTION OF THE EMBODIMENTS

In the following detailed description, reference is made to various exemplary embodiments for carrying out the invention. These embodiments are described with sufficient detail to enable those skilled in the art to practice the invention, and it is to be understood that other embodiments may be employed, and that structural, electrical and process changes may be made, and equivalents substituted, without departing from the invention. Accordingly, the following detailed description is exemplary and the scope of the present invention is not limited by the detailed description but is defined solely by the appended claims.

The term "substrate" used in the following description includes any material, structure or combination of material/structure for which its optical, electronic, and acoustic properties, among others, can be modified by the formation or rearrangement of photonic energy bands in such material, structure, or combination thereof Thus, the term "substrate" is to be understood as including, for example, linear and non-linear optical materials, metals, semiconductors and insulators, acoustic materials, magnetic materials, ferroelectric materials, piezoelectric materials, and superconducting materials, among others. In addition, the term "substrate" is to be understood as including substrates formed of silicon, silicon-on-insulator, doped and undoped semiconductors, epitaxial layers of silicon supported by a base semiconductor foundation, and other semiconductor structures. Further, when reference is made to a semiconductor "substrate" in the following description, previous process steps may have been utilized to form regions or junctions in the base semiconductor structure or foundation.

Figure 14:
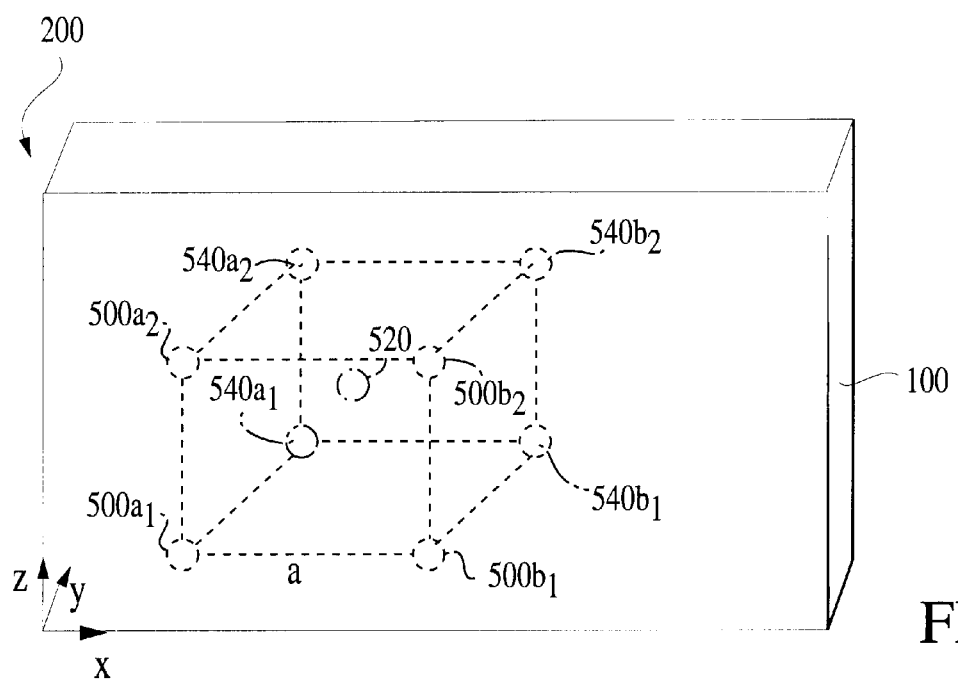
FIG. 14 illustrates a three-dimensional view of the photonic silicon body-centered cubic lattice of FIG. 13 at a stage of processing subsequent to that shown in FIG. 13.
Figure 15:
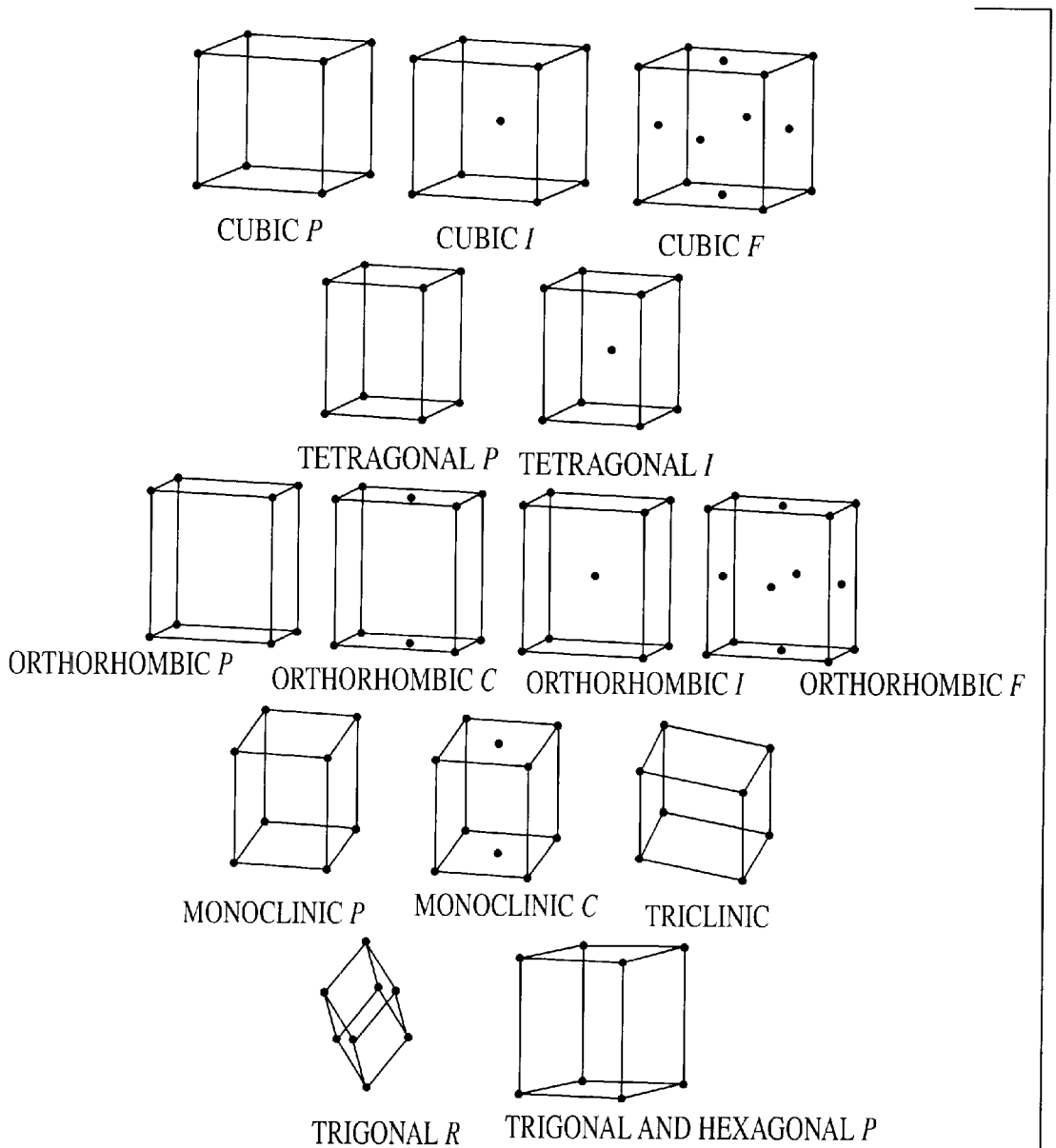
FIG. 15 illustrates fourteen representative unit cells of space lattices which can be constructed according to the methods of the present invention.

Referring now to the drawings, where like elements are designated by like reference numerals, FIG. 15 illustrates exemplary periodic index of refraction patterns which may be formed as patterns of empty spaces (voids) in the lattice of a silicon sample substrate in accordance with the invention. For simplicity, the formation of one such periodic index of refraction void pattern, the cubic I pattern, also called a body-centered cubic structure will be described in detail with reference to FIGS. 3–14. The method of the present invention will be explained with reference to the formation of such a pattern to produce one exemplary photonic band-gap structure in a silicon material with the body-centered cubic symmetry and having a lattice constant "a." Thus, in an exemplary embodiment, a silicon sample substrate 10 (FIG. 3) of <100> crystal orientation is employed to form silicon photonic crystals for interacting with optical wavelengths according to the present invention and as explained below. However, it should be understood that the invention may be used to form any voids in a solid in any refraction pattern desired, those shown in FIG. 15 being representative. Accordingly, for the purposes of the present invention, the term "unit cell" is to be understood as including any of the known space lattice unit cells, or at least one of, or any combination of, the fourteen unit cells of FIG. 15.

Figure 1:
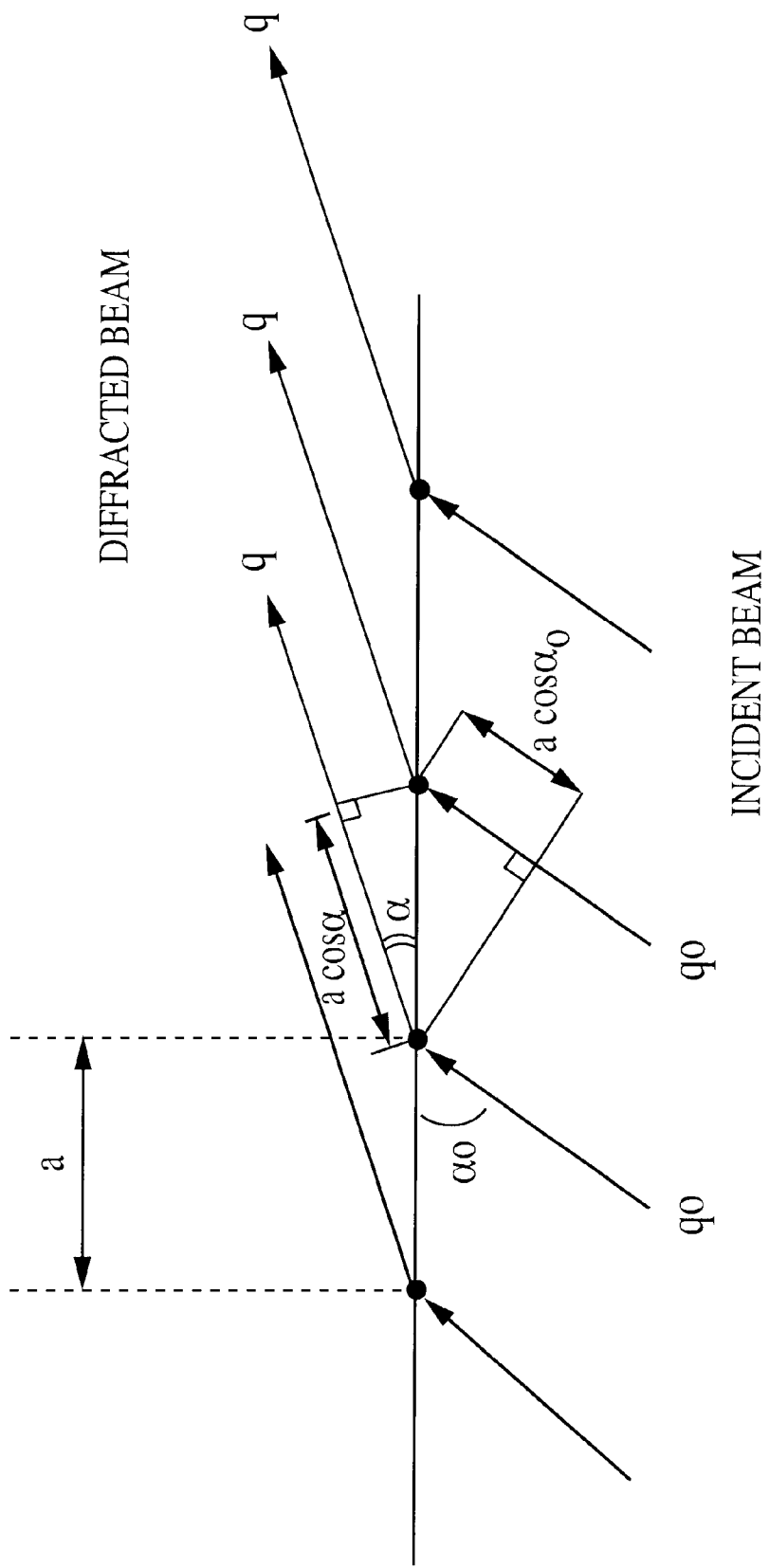
FIG. 1 illustrates the diffraction of an X ray beam in a crystal.
Figure 2:
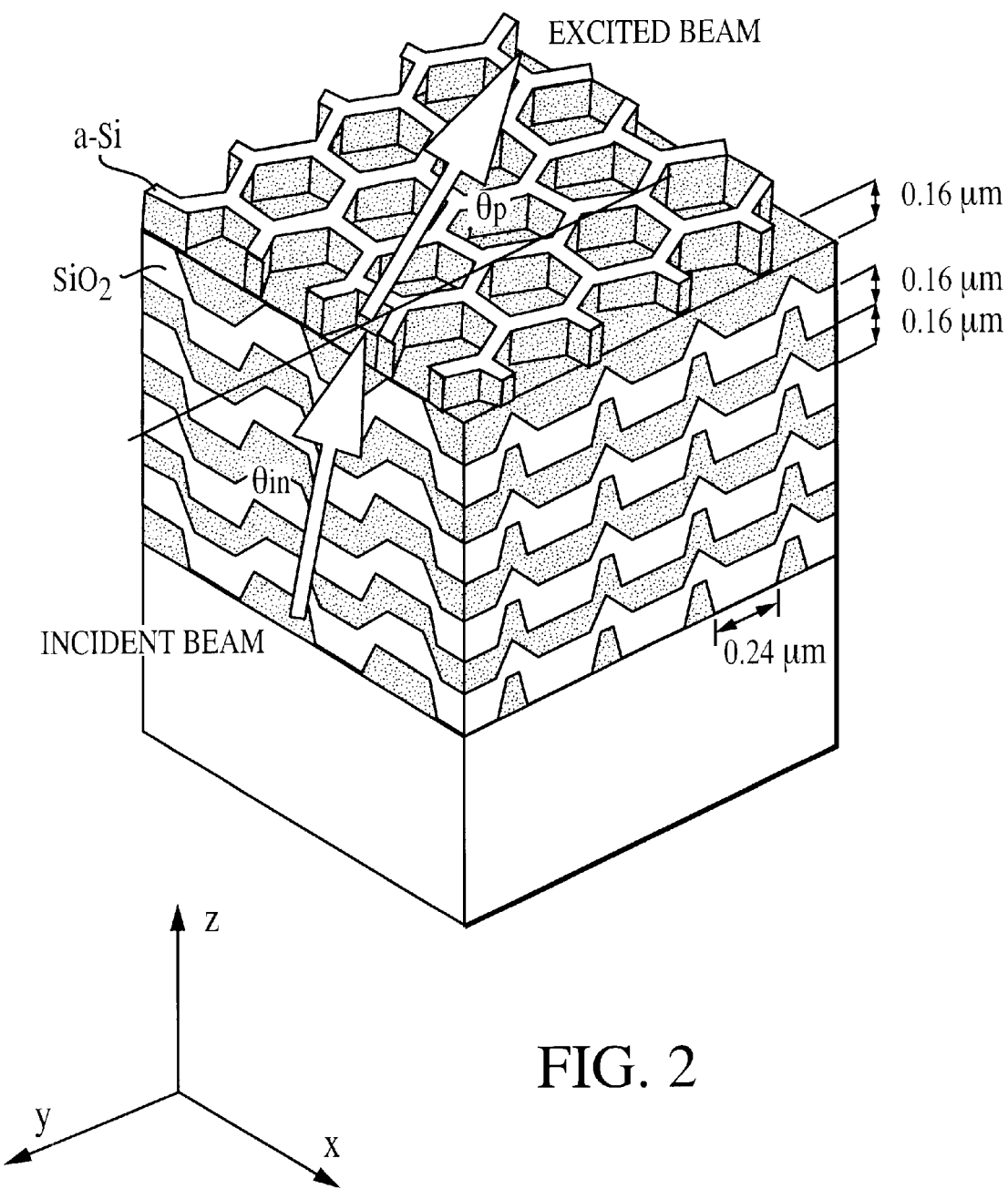
FIG. 2 illustrates a portion of a fabricated 3D periodic index of refraction structure formed by bias sputtering.
Figure 3:
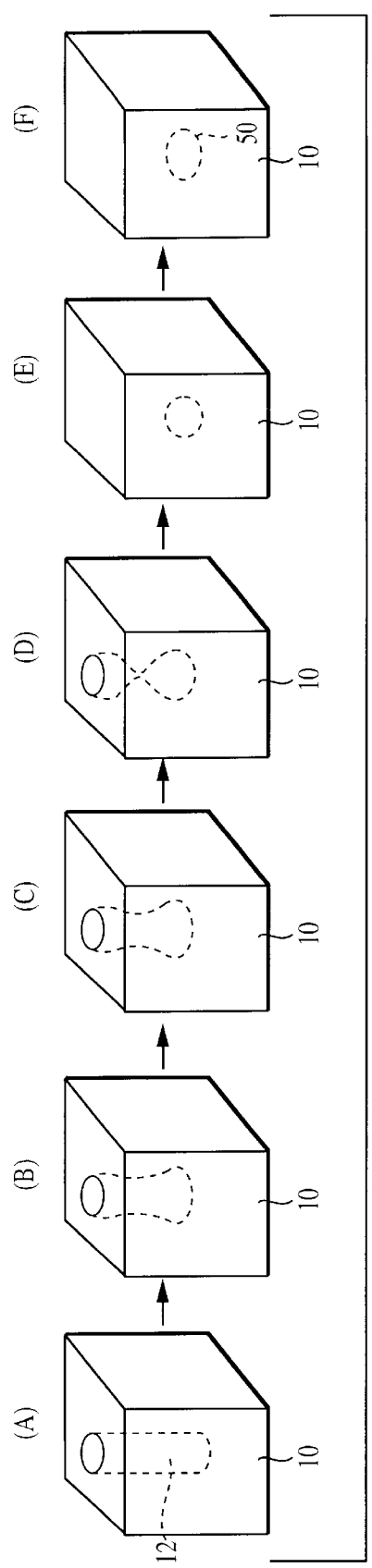
FIG. 3 illustrates a portion of a silicon substrate undergoing a sequence of steps for empty-spaced sphere formation.
Figure 4:
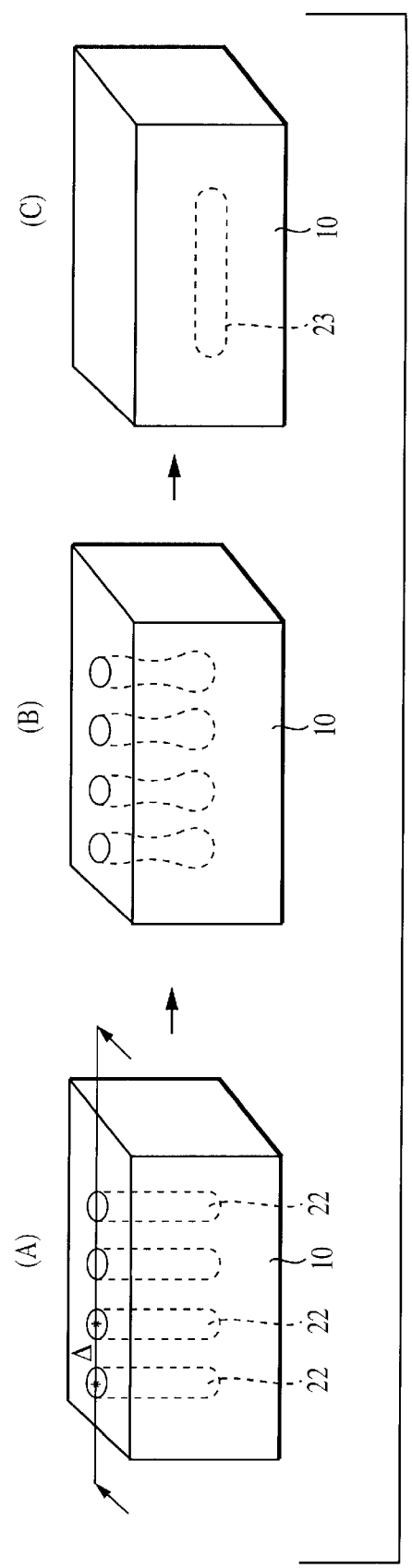
FIG. 4 illustrates a portion of a silicon substrate undergoing a sequence of steps for empty-spaced pipe formation.
Figure 5:
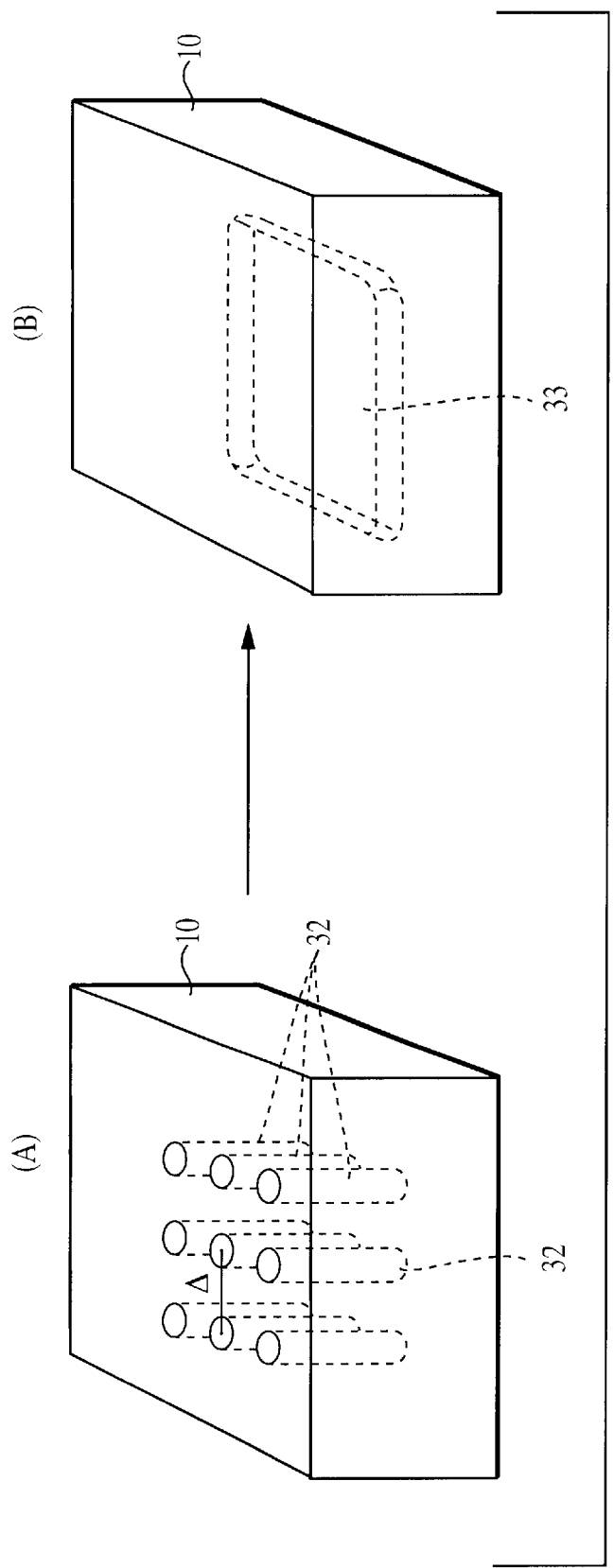
FIG. 5 illustrates a portion of a silicon substrate undergoing a sequence of steps for empty-spaced plate formation.

FIGS. 3–5 illustrate the formation of empty-spaced void patterns 50, 23, 33 in the silicon substrate 10, within which the silicon photonic patterns of the present invention will be formed. Techniques for the formation of empty-space (void) patterns of different geometries in silicon are described by Sato et al., in *Substrate Engineering for the Formation of Empty Space in Silicon (ESS) Induced by Silicon Surface Migration*, 1999 IEDM Digest, Paper 20.6.1, the disclosure of which is incorporated by reference herein.

Empty spaces which are formed in silicon substrates and have various shapes, such as plates, spheres or pipes, may be formed as a result of the self-organizing migration properties on the silicon surface. As such, when deeply-etched silicon substrates are annealed in an ambient atmosphere, such as a hydrogen ambient, for example, the silicon atoms on the surface migrate so that their surface energy is minimized. Based on these findings, Sato et al. have demonstrated that the geometry of empty spaces, such as sphere, plate and pipe, formed under the surface of a silicon substrate depends on the size, number and spacing of a plurality of cylindrical holes that are initially formed at a low temperature.

For example, FIGS. 3(a)–(f) illustrate how a single sphere-shaped empty space 50 is formed from a single cylindrical hole 12 formed within the silicon substrate 10. Subsequent to the formation of the cylindrical hole 12, the silicon substrate 10 is annealed at a temperature lower than the melting point of monocrystalline silicon (1400° C.), for example, at a temperature of about 1100° C. Sato et al. have demonstrated that, within about 60 seconds and under a reducing ambient of 10 Torr of hydrogen, the shape and surface morphology of the cylindrical hole 12 changes drastically to that of the sphere-shaped empty space 50 (FIG. 3(f)). Because of the significant surface and/or volume diffusion which occurs at high annealing temperatures, the cylindrical hole 12 is unstable beyond a critical length Lc and transforms, therefore, to a lower energy state consisting of one or more empty spheres formed along the original cylinder axis.

As analyzed by Nichols et al., in *Surface- (Interface-) and Volume-Diffusion Contributions to Morphological Changes Driven by Capillarity*, Trans. AIME 233 at 1840 (October 1965), the disclosure of which is incorporated by reference herein, the number N of empty spheres that form from a cylindrical hole depends both on the length L of the cylindrical hole and on the cylinder radius Rc. Accordingly, the number N of empty spheres formed from a cylindrical hole made in a silicon substrate can be estimated according to the following equation:

$$8.89\, Rc\, N < L < 8.89\, Rc\, (N+1) \tag{2}$$

wherein: N=number of empty spheres;
Rc=radius of cylindrical hole; and
L=length of cylindrical hole.

Thus, equation (2) predicts that, if L<8.89 Rc, the number of empty spheres will be N=0, which means that no empty spheres will form from a cylindrical hole.

When one or more empty spheres form with a radius Rs, then according to Nichols et al., the value of Rs is given by the following equation:

$$Rs = 1.88\, Rc \tag{3}$$

wherein: Rs=sphere radius; and
Rc=radius of cylindrical hole.

When two or more empty spheres form from a cylinder hole with a cylinder radius Rc, then the distance 1 between the centers of two adjacent empty-spaced spheres is calculated from the following formula:

$$1 = 8.89\, Rc \tag{4}$$

wherein: 1=center-to-center distance between two adjacent spheres; and
Rc=radius of cylindrical hole.

Reference is now made to FIGS. 4(a)–(c), which exemplify the formation of a single pipe-shaped empty space 23 from a linear array of cylindrical holes 22. Similarly, FIGS. 5(a)–(b) illustrate the formation of a single plate-shaped empty space 33 from a two-dimensional array of cylindrical holes 32 formed within a silicon substrate such as the silicon substrate 10. The values of the pipe radius Rp (of the pipe-shaped empty space 23) and that of the plate thickness Tp (of the plate-shaped empty space 33) may be calculated in a manner similar to that described above with reference to the formation of the empty sphere 50 and the calculation of sphere radius Rs in equation (2). The distance A between the centers of any two adjacent cylindrical holes 22, 32, in a linear array, may be calculated from the following formula:

$$2\, Rc < \Delta < 3.76\, Rc \tag{5}$$

wherein: Rc=radius of cylindrical hole; and
Δ=center-to-center distance between two adjacent cylindrical holes in a linear array.

Equation (5) ensures that adjacent cylindrical holes 22, 32 do not touch each other allowing, therefore, the formation of a plurality of adjacent spheres that combine to form the resulting pipe-shaped empty space 23 and plate-shaped empty space 33.

The values of the pipe radius Rp and of the plate thickness Tp are given by the following two expressions:

$$Rp = (8.86\, Rc^3/\Delta)^{1/2} \tag{6}$$

$$Tp = 27.83\, Rc^3/\Delta^2 \tag{7}$$

wherein: Rp=pipe radius;
Tp=plate thickness; and

Δ=center-to-center distance between two adjacent cylindrical holes in a linear array.

Figure 12:
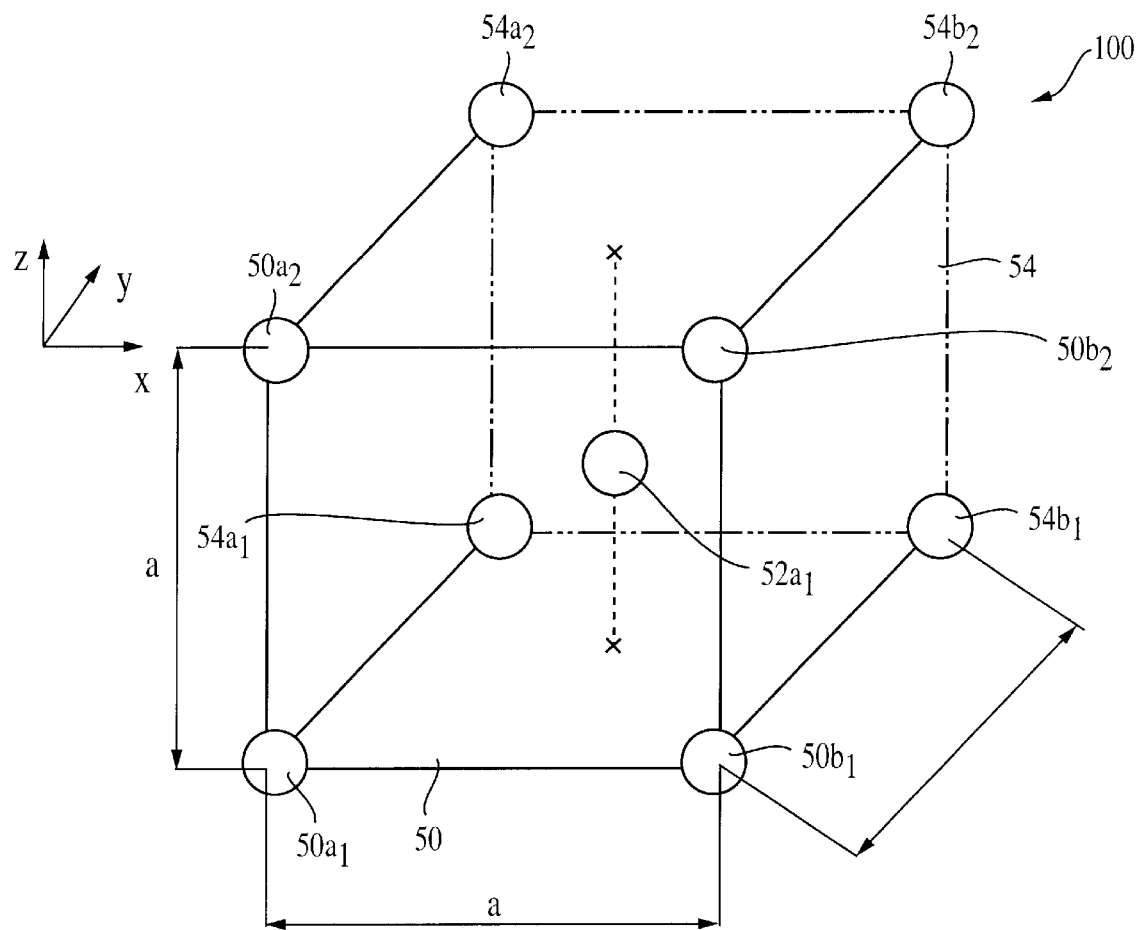
FIG. 12 illustrates a three-dimensional view of the photonic silicon body-centered cubic lattice of FIG. 6 at stage of processing subsequent to that shown in FIG. 11, and depicting a body-centered cubic unit.
Figure 13:
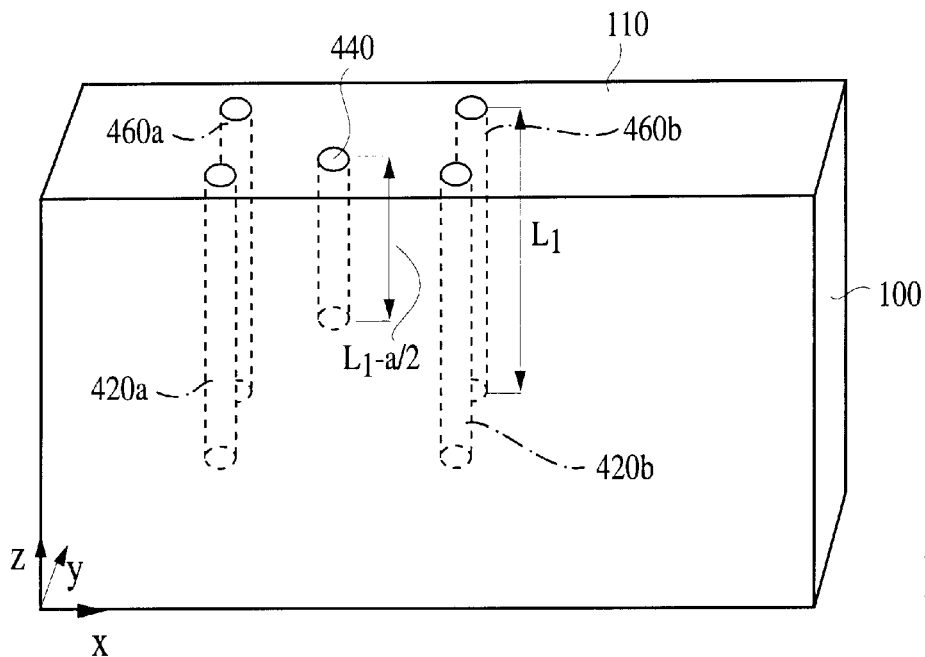
FIG. 13 illustrates a three-dimensional view of a photonic silicon body-centered cubic lattice with empty-spaced spherical patterns according to a second embodiment of the present invention and at an intermediate stage of processing.

To illustrate the formation of an exemplary embodiment of a photonic bandgap structure in a periodic index of refraction pattern, the present invention will be explained with reference to the formation of a body-centered cubic lattice formed of periodic body-centered cubic units 100 (FIG. 12) having empty-spaced spheres formed by the empty-spaced structure formation technique described above with reference to FIGS. 3–5. As such, during the first step in the formation of the body-centered cubic unit 100 (FIG. 12), two linear cylindrical holes 42a (FIG. 6) and 42b (FIG. 6) are drilled into silicon substrate 10 from an upper surface 11 of the silicon substrate 10 to a depth L1, which also represents the length of the cylindrical holes 42a, 42b. The two cylindrical holes 42a, 42b are spaced apart into the silicon substrate 10 at a distance "a," which represents the lattice constant of the body-centered cubic unit 100 (FIG. 12).

Applying equation (2) to the parameters of a body-centered cubic unit, the number of empty spheres N to be obtained from the single cylindrical hole 42a, for example, depends upon the cylinder radius Rc1 and the length L1 of the cylindrical hole 42a. Accordingly, the relationship between the number of spheres N and the length L1 of the cylindrical hole 42a, for example, will be satisfied by the following equation:

$$L1 = 8.89\, Rc1\, (N+1) \quad (8)$$

wherein: N=number of empty spheres formed from cylindrical hole 42a;

Rc1=radius of cylindrical hole 42a; and

L1=length of cylindrical hole 42a.

Equations (3) and (4) further determine the radius Rs of each sphere 50a1, 50a2 (FIG. 7) formed from the cylindrical hole 42a, for example, and the distance λ between any two adjacent spheres, for example 50a1, 50a2, formed from the cylindrical holes 42a and 42b, respectively. Accordingly, $$Rs1 = 1.88\, Rc1 \quad (9)$$

wherein: Rs1=radius of spheres 50a1, 50a2 formed from cylindrical hole 42a; and Rc1=radius of cylindrical hole 42a.

Since the distance k between any two adjacent spheres 50a1, 50a2 with radius Rs1 must equal the lattice constant "a," it follows that:

$$a = 8.89\, Rc1,\ \text{or}\ Rc1 = a/8.89 \quad (10)$$

wherein: a=distance between any two adjacent spheres 50a1, 50a2; and

Rc1=radius of cylindrical hole 42a.

Thus, according to equations (8), (9) and (10), the depth L1 at which a cylindrical hole 42a with a cylinder diameter Rc1 must be drilled to obtain a plurality of empty spheres N, each of them being spaced apart at distance "a" and each of them having a sphere radius Rs1, must satisfy the equation:

$$L1 = a(N+1) = 8.99\, Rc1\, (N+1) \quad (11)$$

wherein: L1=length of cylindrical hole 42a;

a=distance between two adjacent spheres 50a1, 50a2; and

Rc1=radius of cylindrical hole 42a.

Figure 7:
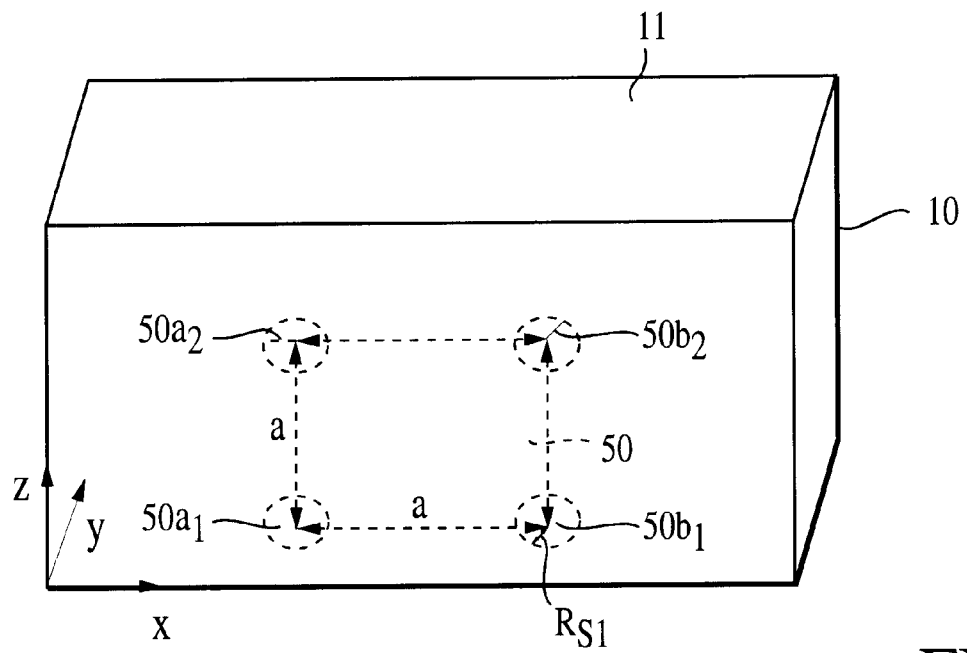
FIG. 7 illustrates a three-dimensional view of the photonic silicon body-centered cubic lattice of FIG. 6 at stage of processing subsequent to that shown in FIG. 6.

To obtain a number N=2 of empty-space spheres 50a1, 50a2 from the cylindrical hole 42a, for example, the silicon substrate 10 is annealed at a temperature of about 1100° C. and under an ambient atmosphere, for example a reducing ambient of about 10 Torr of hydrogen. Thus, within about 60 seconds the two empty-spaced spheres 50a1 and 50a2 are formed within the silicon substrate 10 from cylindrical hole 42a. Similarly, two empty-spaced spheres 50b1 and 50b2 are formed within the silicon substrate 10 from cylindrical hole 42b, as also shown in FIG. 7. The empty-spaced spheres 50a1, 50a2, 50b1 and 50b2 form a first square array 50 (FIG. 7) of empty-spaced spheres.

Figure 8:
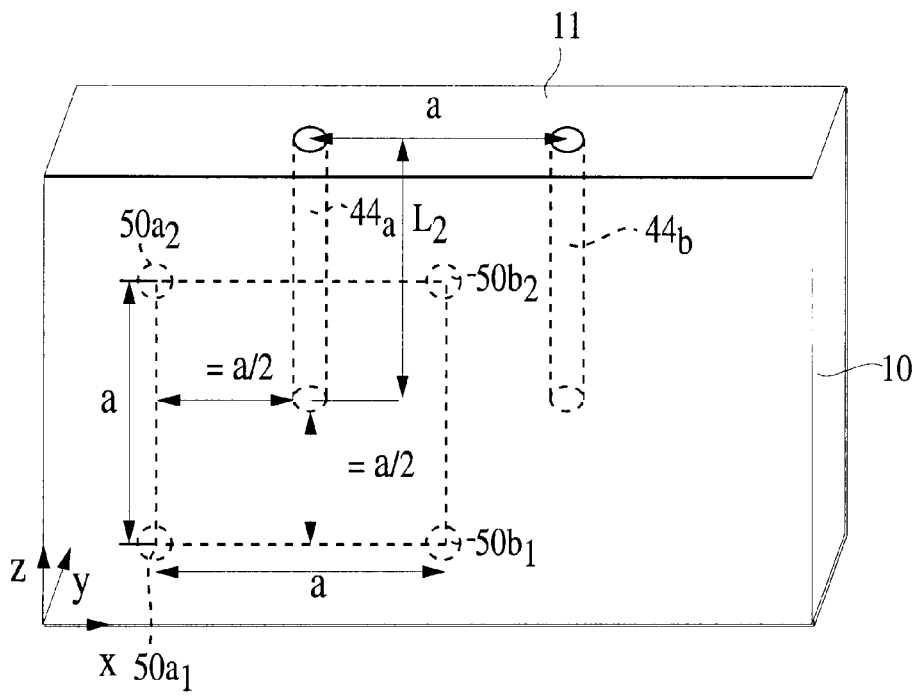
FIG. 8 illustrates a three-dimensional view of the photonic silicon body-centered cubic lattice of FIG. 6 at stage of processing subsequent to that shown in FIG. 7.
Figure 9:
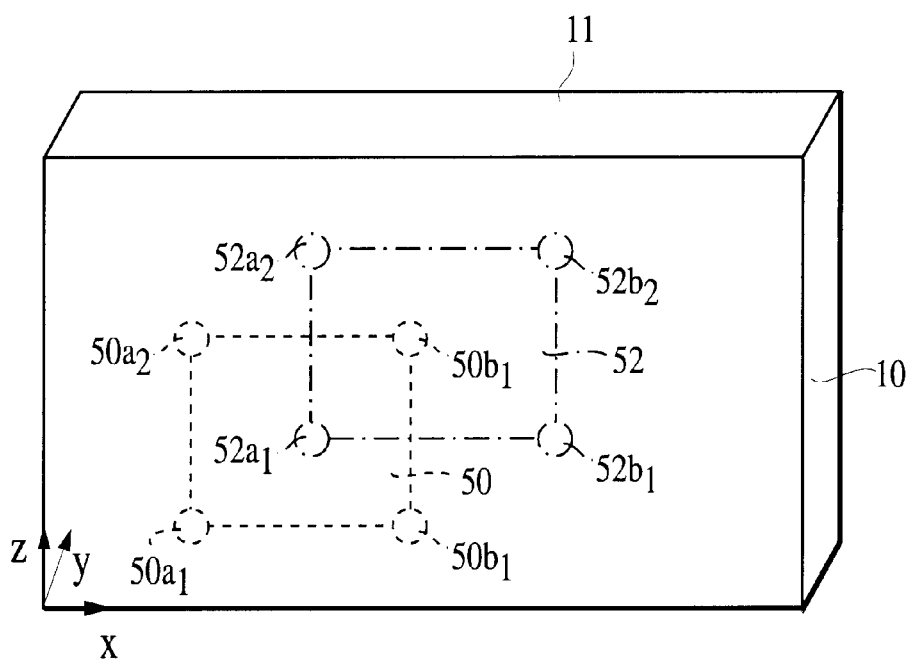
FIG. 9 illustrates a three-dimensional view of the photonic silicon body-centered cubic lattice of FIG. 6 at stage of processing subsequent to that shown in FIG. 8.
Figure 10:
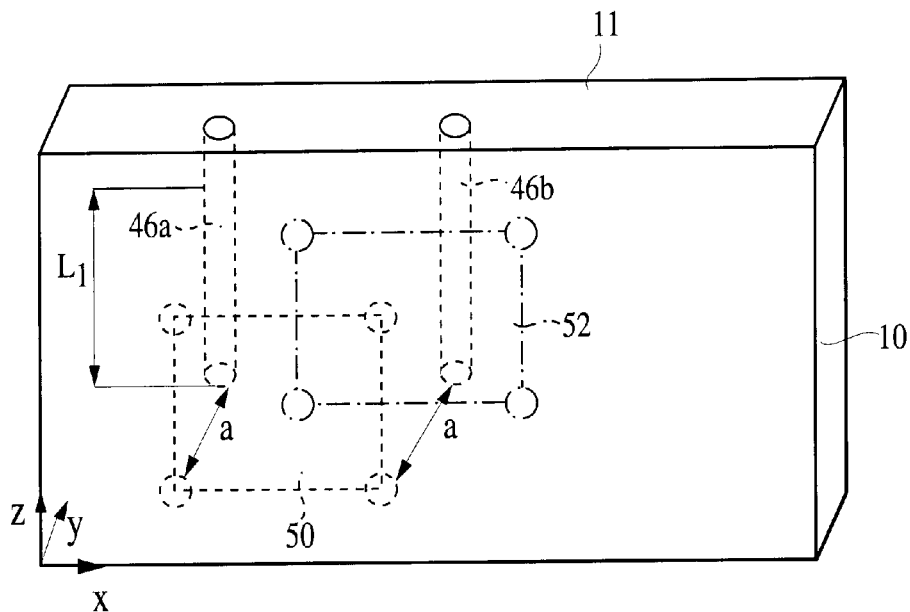
FIG. 10 illustrates a three-dimensional view of the photonic silicon body-centered cubic lattice of FIG. 6 at stage of processing subsequent to that shown in FIG. 9.

FIG. 8 illustrates the formation of another set of cylindrical holes 44a and 44b which form another set of empty-spaced spheres 52a1, 52a2, 52b1, and 52b2, as illustrated in FIG. 9. The cylindrical holes 44a and 44b (FIG. 8) are drilled into the silicon substrate 10, from the upper surface 11 of the substrate 10, to a depth L2, which also represents the length of the cylindrical holes 44a, 44b. The two cylindrical holes 44a and 44b are spaced apart at a distance "a," which represents the lattice constant of the body-centered cubic cell 100 (FIG. 12). However, as shown in FIG. 8, each of the cylindrical holes 44a, 44b are displaced by a distance D=a/2 in the x-axis direction and in the y-axis direction with respect to the cylindrical holes 42a, 42b used to form the first square array 50 of empty-spaced spheres.

The depth L2 to which the cylindrical holes 44a, for example, is drilled into the silicon substrate 10 is calculated from the formula:

$$L2 = L1 - (a/2) \quad (12)$$

wherein: L2=length of cylindrical hole 44a;

L1=length of cylindrical hole 42a; and a=lattice constant.

Accordingly, if a=8.89 Rc2 (equation (9)), then $$L2 = a(N+1) - (a/2) = a(N+½) = 8.89\, Rc2\, (N+½) \quad (13)$$

wherein: L2=length of cylindrical hole 44a;

Rc2=radius of cylindrical hole 44a; and

N=number of empty spheres formed from cylindrical hole 44a.

Thus, to obtain a predetermined number N of empty-spaced spheres from the cylindrical hole 44a, for example, with the length L2, the radius Rc2 of the respective cylindrical hole 44a must be calculated and adjusted with respect to its length L2. According to equation (3), the radius Rs of each empty-spaced sphere 52a1, 52a2, 52b1, and 52b2 is then calculated with respect to the radius of the cylindrical hole Rc2 from which the spheres were formed.

The silicon substrate 10 is then annealed at a temperature of about 1100° C. and under a reducing ambient of about 10 Torr of hydrogen, so that within about 60 seconds two empty-spaced spheres 52a1 and 52a2 (FIG. 9) are formed within the silicon substrate 10 from cylindrical hole 44a, and two empty-spaced spheres 52b1 and 52b2 (FIG. 9) are formed within the silicon substrate 10 from cylindrical hole 44b. The empty-spaced spheres 52a1, 52a2, 52b1 and 52b2 form a second square array 52 (FIG. 9) of empty-space spheres.

Figure 6:
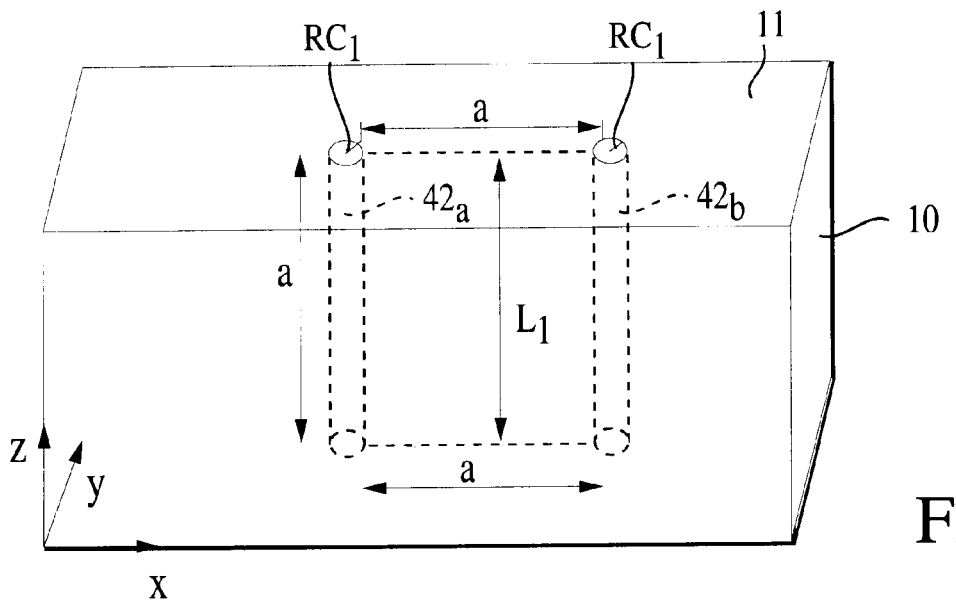
FIG. 6 illustrates a three-dimensional view of a photonic silicon body-centered cubic lattice with empty-spaced spherical patterns according to a first embodiment of the present invention and at an intermediate stage of processing.

Subsequent to the formation of the second square array 52 (FIG. 9), a third square array 54 (FIG. 11) with empty-spaced spheres 54a1, 54a2, 54b1, and 54b2 (FIG. 11) is formed within the silicon substrate 10. For this, cylindrical holes 46a and 46b (FIG. 10) are drilled into the silicon substrate 10, from the upper surface 11 of the silicon substrate 10, to the depth L1, in a similar way to the formation of the cylindrical holes 42a and 42b (FIG. 6). The two cylindrical holes 46a, 46b are spaced apart by the distance "a," the lattice constant of the body-centered cubic cell 100 (FIG. 12). However, the cylindrical hole 46a is displaced by a distance "a" in the y-axis direction with respect to the cylindrical hole 42a, while the cylindrical hole 46b is also displaced by a distance "a" in the y-axis direction with respect to the cylindrical hole 42b.

Figure 11:
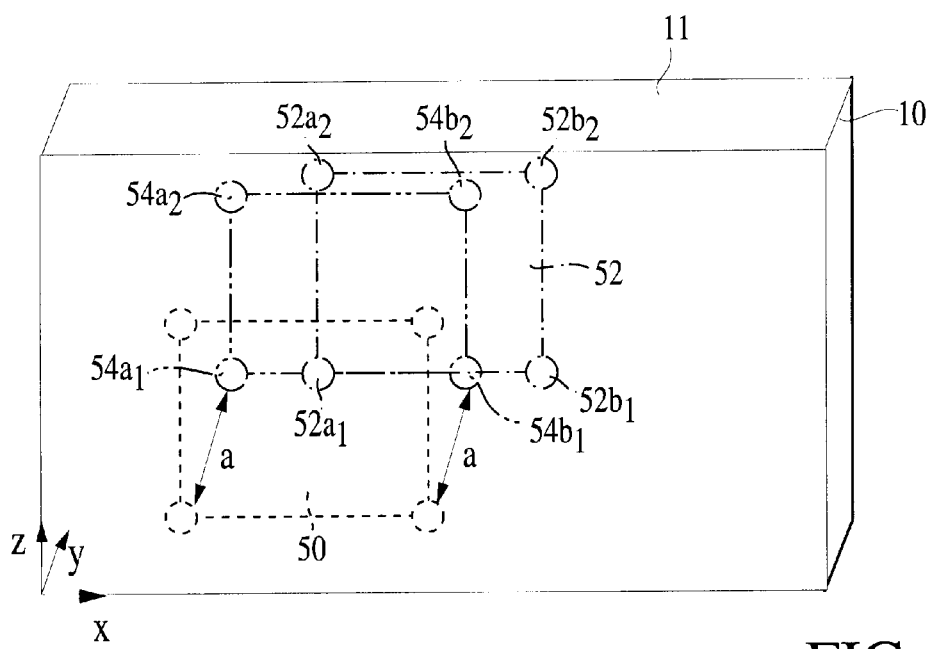
FIG. 11 illustrates a three-dimensional view of the photonic silicon body-centered cubic lattice of FIG. 6 at stage of processing subsequent to that shown in FIG. 10.

Referring now to FIG. 11, the silicon substrate 10 is then annealed at a temperature of about 1100° C. and under a reducing ambient of about 10 Torr of hydrogen, so that within about 60 seconds two empty-spaced spheres 54a1 and 54a2 (FIG. 11) are formed within the silicon substrate 10 from cylindrical hole 46a, and two empty-spaced spheres 54b1 and 54b2 (FIG. 11) are formed within the silicon substrate 10 from cylindrical hole 46b. The empty-spaced spheres 54a1, 54a2, 54b1 and 54b2 form a third square array 54 (FIG. 11) of empty-spaced spheres. Thus, the first square array 50 containing the empty-spaced spheres 50a1, 50a2, 50b1, and 50b2, the third square array 54 containing the empty-space spheres 54a1, 54a2, 54b1, and 54b2 and the empty-spaced sphere 52a1 of the second square array 52 form the body-centered cubic unit 100 of FIG. 12.

By arranging the empty-space void patterns (for example, the empty-spaced spheres $52a_1$, 54b1, etc) in a particular order and in a predetermined periodic form (for example, the body-centered cubic unit 100 of FIG. 12) in a substrate photonic material, the empty-spaced voids act as diffraction centers that follow equation (1). The periodicity of the empty-spaced voids formed according to the present invention will dictate the wavelength in which the particular photonic material scatters. Accordingly, the distance of separation between adjacent empty-spaced voids, which is also the lattice constant "a," may be chosen to have a particular value that would allow diffraction to occur at a particular wavelength. For example, if the value of "a" is very big, in fractions of centimeters, then the microwave spectrum occurs. Conversely, if the value of "a" is very small, in fractions of wavelength of light, then the optical range occurs. This way, by adjusting the value of "a" for a given solid material, one skilled in the art can predict when an allowed energy band or a forbidden energy band (phototnic bandgap) may occur in such solid material.

Thus, the present invention provides a method for forming diffraction voids, arranged in periodic form in the superlattices of a solid material, that will modify the transmission and reflection properties of the solid material, and consequently, the energy bands for light in such material.

Although the first, second and third square arrays 50, 52 and 54 contain only four empty-spaced spheres per square array formed from two cylindrical holes, it must be understood that in fact any number of such cylindrical holes may be drilled so that any number of their corresponding empty-spaced spheres may be formed in the superlattice of the silicon substrate 10, as desired. Accordingly, although the method of the present invention has been explained with reference to the formation of only one body-centered cubic unit 100 (FIG. 12), it must be obvious to those skilled in the art that in fact any number of such body-centered cubic units forming the photonic bandgap lattice may be formed within the substrate 10 by methods of the present invention.

For simplicity, the method of the present invention has been explained with reference to the formation of the first and third square arrays 50, 54 (FIGS. 7–12) as subsequent processing steps for the formation of the body-centered cubic unit 100 of FIG. 12. However, it must be understood that the formation of the first square array 50 could be simultaneous with the formation of the third square array 54. Accordingly, the cylindrical holes 42a and 42b (forming the first square array 50) and the cylindrical holes 46a and 46b may be drilled simultaneously into the silicon substrate 10, from the upper surface 11 of the silicon substrate 10. As such, the first and third square arrays 50, 54 are formed simultaneously, and only then the second square array 52 is formed, as explained above, to form the body-centered cubic unit 100 (FIG. 12).

In yet another embodiment, all cylindrical holes can be drilled at once and a single anneal step can be used to form a body-centered cubic unit 200 (FIG. 14). In such embodiment, cylindrical holes 420a, 420b, 460a, 460b and 440 are drilled simultaneously into a silicon substrate 100, from the upper surface 110 of the silicon substrate 100. Cylindrical holes 420a, 420b and 460a, 460b are drilled simultaneously at a depth L1 (FIG. 13), which represents the length of the cylindrical holes 420a, 420b, 460a, and 460b, while cylindrical hole 440 is drilled at a depth (L1−a/2), wherein (L1−a/2) represents the length of the cylindrical hole 440. The silicon substrate 100 is then annealed at a temperature of about 1100° C. and under a reducing ambient of about 10 Torr of hydrogen, so that within about 60 seconds two empty-spaced spheres 500a1 and 500a2 (FIG. 14) are formed within the silicon substrate 100 from cylindrical hole 420a, two empty-spaced spheres 500b1 and 500b2 (FIG. 14) are formed within the silicon substrate 100 from cylindrical hole 420b, two empty-space spheres 540a1 and 540a2 (FIG. 14) are formed within the silicon substrate 100 from cylindrical hole 460a, two empty-space spheres 540b1 and 540b2 (FIG. 14) are formed within the silicon substrate 100 from cylindrical hole 460b, and one empty-space sphere 520 (FIG. 14) is formed within the silicon substrate 100 from cylindrical hole 440. The nine empty-spaced spheres 500a1, 500a2, 500b1, 500b2, 540a1, 540a2, 540b1, 540b2 and 520 form the body-centered cubic unit 200 (FIG. 14). Of course, any number of such body-centered cubic units 200 may be formed within the substrate 100 by methods of the present invention to produce a repeating body-centered cubic lattice of empty spheres.

Although the exemplary embodiments described above refer to the formation of a lattice of unit cells having a specific body-centered cubic configuration, it must be understood that other lattices of unit cells may be formed, depending on the characteristics of the particular lattice and photonic bandgap structure to be fabricated. FIG. 15 illustrates, for example, a plurality of conventional representative unit cells forming various space lattices, as described by C. Kittel in *Introduction to Solid State Physics* (J. Whiley & Sons, 3d Ed (1966)), which may be formed as voids in a solid material in accordance with the invention.

Further, the invention is not limited to the formation of a unit cell having the diffraction centers formed of empty-spaced spheres, but other patterns, for example pipes, such as the empty-space pipe 23 (FIG. 4), and/or plates, such as the empty-space plate 33 (FIG. 5), may be employed in any number or orientation and any combination to form the unit cells of FIG. 15. In addition, although the invention has been described with reference to the formation of empty-spaced spheres forming diffraction centers and having similar radii, the invention also contemplates the formation of empty-spaced spheres having different radii. Finally, the empty-spaced patterns formed according to embodiments of the present invention act as diffraction centers not only for optical wavelengths, but for other energy particles, such as, for example, microwaves, photons, X rays, gamma rays, as well as for magnetic waves, elastic waves, electrons and/or ions, among others.

The above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method of modifying the energy band characteristics of an atomic lattice of a solid material, comprising the act of forming at least one unit cell beneath a surface of, and within, said solid material, said unit cell comprising a plurality of empty-spaced regions arranged in a pattern, said empty space regions being surrounded by said solid material.

2. The method of claim 1, wherein said empty-spaced regions act as diffraction centers for energy particles.

3. The method of claim 2, wherein said energy particles are electromagnetic waves.

4. The method of claim 3, wherein said energy particles are selected from the group consisting of microwaves, photons, X rays and gamma rays.

5. The method of claim 2, wherein said energy particles are light particles.

6. The method of claim 2, wherein said energy particles are magnetic waves.

7. The method of claim 2, wherein said energy particles are elastic waves.

8. The method of claim 2, wherein said energy particles are electrons.

9. The method of claim 2, wherein said energy particles are ions.

10. The method of claim 1, wherein the act of forming said plurality of empty-spaced regions further comprises the act of forming at least one hole within said solid material and heat treating said solid material to form said empty-spaced regions beneath said surface of said solid material.

11. The method of claim 10, wherein said hole is a cylindrical hole.

12. The method of claim 10, wherein said solid material is heat treated at a temperature lower than the melting temperature of said solid material.

13. The method of claim 12, wherein said solid material is silicon and is heat treated at 1100° C. under a hydrogen ambient of 10 Torr.

14. The method of claim 13, wherein silicon is heat treated for about 60 seconds.

15. The method of claim 1, wherein at least one of said empty-spaced regions has a pipe-shaped configuration.

16. The method of claim 1, wherein at least one of said empty-spaced regions has a spherical configuration.

17. The method of claim 1, wherein at least one of said empty-spaced regions has a plate-shaped configuration.

18. The method of claim 1, wherein said plurality of empty-spaced regions are empty-space spheres.

19. The method of claim 18, wherein said empty-spaced spheres have similar radii.

20. The method of claim 18, wherein said empty-spaced spheres have different radii.

21. The method of claim 1, wherein said unit cell is a cubic cell.

22. The method of claim 1, wherein said unit cell is a body-centered cubic cell.

23. The method of claim 1, wherein said solid material is a magnetic material.

24. The method of claim 1, wherein said solid material is a ferroelectric material.

25. The method of claim 1, wherein said solid material is a piezoelectric material.

26. The method of claim 1, wherein said solid material is selected from the group consisting of metals, semiconductors and insulators.

27. The method of claim 1, wherein said solid material is a semiconductor.

28. The method of claim 27, wherein said semiconductor is silicon.

29. A method of forming a space lattice in a solid material, said method comprising the steps of:
    forming a first plurality of cylindrical holes in said solid material;
    annealing said solid material to form a first plurality of empty-spaced patterns within, and surrounded by, said solid material and below a surface of said solid material;
    forming a second plurality of cylindrical holes in said solid material, said second plurality of cylindrical holes being located parallel to said first plurality of cylindrical holes relative to said surface of said solid material; and
    annealing said solid material to form a second plurality of empty-spaced patterns within, and surrounded by, said solid material and below said surface of said solid material.

30. The method of claim 29, wherein said first plurality of empty-spaced patterns form a first photonic band structure in said solid material.

31. The method of claim 30, wherein said second plurality of empty-spaced patterns form a second photonic band structure in said solid material.

32. The method of claim 31, wherein said first photonic band structure has identical characteristics to the characteristics of said second photonic band structure.

33. The method of claim 31, wherein said first photonic band structure has different characteristics than the characteristics of said second photonic band structure.

34. The method of claim 29, wherein said acts of annealing are performed under an ambient atmosphere.

35. The method of claim 34, wherein said ambient atmosphere is a reducing hydrogen atmosphere at a temperature lower than the melting temperature of said solid material.

36. The method of claim 35, wherein said act of annealing is performed for about 60 seconds.

37. The method of claim 29, wherein said first and second plurality of empty-spaced patterns include a pipe-shaped pattern.

38. The method of claim 29, wherein said first and second plurality of empty-spaced patterns include a plate-shaped pattern.

39. The method of claim 29, wherein said first and second plurality of empty-spaced patterns include a sphere-shaped pattern.

40. The method of claim 29, wherein said first and second plurality of empty-spaced patterns are simultaneously formed.

41. The method of claim 40, wherein said first plurality of empty-spaced patterns is located below said second plurality of empty-spaced patterns relative to said surface of said solid material.

42. The method of claim 29, wherein said solid material is a monocrystalline substrate.

43. The method of claim 42, wherein said monocrystalline substrate is a silicon substrate.

44. The method of claim 29, wherein said solid material is selected from the group consisting of metals, semiconductors and insulators.

45. A method of altering properties of a solid material to have a predetermined energy band characteristic by forming empty-spaced regions in said solid material, said empty-spaced regions being arranged in a pattern, said pattern providing said solid material with said predetermined energy band characteristic.

46. The method of claim 45, wherein said empty-spaced regions act as diffraction centers for energy particles.

47. The method of claim 46, wherein said energy particles are electromagnetic waves.

48. The method of claim 46, wherein said energy particles are magnetic waves.

49. The method of claim 46, wherein said energy particles are elastic waves.

50. The method of claim 46, wherein said energy particles are electrons.

51. The method of claim 46, wherein said energy particles are ions.

52. The method of claim 45, wherein said act of forming said empty-spaced regions further comprises the act of forming at least one hole within said solid material and heat treating said solid material to form said empty-space regions beneath a surface of said solid material.

53. The method of claim 52, wherein said hole is a cylindrical hole.

54. The method of claim 52, wherein said solid material is heat treated at a temperature lower than the melting temperature of said solid material.

55. The method of claim 54, wherein said solid material is heat treated under a hydrogen ambient.

56. The method of claim 55, wherein said solid material is silicon and is heat treated under a hydrogen ambient for about 60 seconds.

57. The method of claim 45, wherein at least one of said empty-spaced regions has a pipe-shaped configuration.

58. The method of claim 45, wherein at least one of said empty-spaced regions has a spherical configuration.

59. The method of claim 45, wherein at least one of said empty-spaced areas has a plate-shaped configuration.

60. The method of claim 45, wherein said empty-space areas are empty-spaced spheres.

61. The method of claim 60, wherein said empty-spaced spheres have similar radii.

62. The method of claim 60, wherein said empty-spaced spheres have different radii.

63. The method of claim 45, wherein said pattern comprises at least a unit cell.

64. The method of claim 63, wherein said unit cell is a cubic cell.

65. The method of claim 63, wherein said unit cell is a body-centered cubic cell.

66. The method of claim 45, wherein said solid material is a magnetic material.

67. The method of claim 45, wherein said solid material is a ferroelectric material.

68. The method of claim 45, wherein said solid material is a piezoelectric material.

69. The method of claim 45, wherein said solid material is selected from the group consisting of metals, semiconductors and insulators.

70. The method of claim 45, wherein said solid material is a semiconductor.

71. The method of claim 70, wherein said semiconductor is silicon.

* * * * *

UNITED STATES PATENT AND TRADEMARK OFFICE
CERTIFICATE OF CORRECTION

PATENT NO. : 6,582,512 B2
DATED : June 24, 2003
INVENTOR(S) : Kevin G. Donohoe et al.

It is certified that error appears in the above-identified patent and that said Letters Patent is hereby corrected as shown below:

<u>Column 7,</u>
Line 46, replace "k" with -- $\lambda$ --.

Signed and Sealed this

Fourth Day of November, 2003

JAMES E. ROGAN
*Director of the United States Patent and Trademark Office*